United States Patent
Liao et al.

(10) Patent No.: US 9,543,483 B2
(45) Date of Patent: Jan. 10, 2017

(54) EPITAXY BASE AND LIGHT-EMITTING DEVICE

(71) Applicant: PlayNitride Inc., Tainan (TW)

(72) Inventors: Kuan-Yung Liao, Tainan (TW); Yun-Li Li, Tainan (TW); Chih-Ling Wu, Tainan (TW); Yen-Lin Lai, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/740,283

(22) Filed: Jun. 16, 2015

(65) Prior Publication Data
US 2016/0005935 A1    Jan. 7, 2016

(30) Foreign Application Priority Data
Jul. 2, 2014 (TW) .................................. 103122875

(51) Int. Cl.
| | | |
|---|---|---|
| *H01L 33/50* | (2010.01) | |
| *F21K 99/00* | (2016.01) | |
| *F21V 9/16* | (2006.01) | |
| *H01L 33/44* | (2010.01) | |
| *H01L 33/08* | (2010.01) | |
| *H01L 33/00* | (2010.01) | |
| *H01L 21/02* | (2006.01) | |

(52) U.S. Cl.
CPC .............. *H01L 33/508* (2013.01); *H01L 33/08* (2013.01); *H01L 21/02488* (2013.01); *H01L 21/02494* (2013.01); *H01L 21/02502* (2013.01); *H01L 33/007* (2013.01); *H01L 33/502* (2013.01)

(58) Field of Classification Search
CPC .......... H01L 33/20; H01L 33/22; H01L 33/44; H01L 33/50; H01L 33/505; H01L 33/507; H01L 33/508
See application file for complete search history.

(56) References Cited

U.S. PATENT DOCUMENTS

| | | | | |
|---|---|---|---|---|
| 7,825,577 B2* | 11/2010 | Hsu | ........................ | H01L 33/007 313/498 |
| 2002/0074558 A1* | 6/2002 | Hata | ...................... | H01L 33/508 257/89 |
| 2006/0097275 A1* | 5/2006 | Tsai | ..................... | H01L 51/5206 257/98 |
| 2007/0054149 A1* | 3/2007 | Cheng | ................... | H01L 27/322 428/690 |

(Continued)

OTHER PUBLICATIONS

Scientific Material Corp., http://www.scientificmaterials.com/products/ndyag_yttrium_aluminum_garnet.php.*
http://www.webelements.com/phosphorus/thermochemistry.html.*

*Primary Examiner* — Peniel M Gumedzoe
(74) *Attorney, Agent, or Firm* — Jianq Chyun IP Office

(57) ABSTRACT

An epitaxy base adapted to form a light-emitting device on is provided. The epitaxy base includes a substrate and a patterned wavelength conversion structure disposed on a part of the substrate and protruding out from the substrate. A light-emitting device including the epitaxy base, a first type semiconductor layer, an emitting layer and a second type semiconductor layer is provided. The first type semiconductor layer is disposed on the substrate and the patterned wavelength conversion structure. The emitting layer is disposed on the first type semiconductor layer. The second type semiconductor layer is disposed on the emitting layer.

10 Claims, 3 Drawing Sheets

(56) References Cited

U.S. PATENT DOCUMENTS

| | | | |
|---|---|---|---|
| 2007/0228931 A1* | 10/2007 | Kim | C09K 11/7734 313/501 |
| 2012/0012875 A1* | 1/2012 | Ooyabu | H01L 33/507 257/98 |
| 2012/0086028 A1* | 4/2012 | Beeson | H01L 33/501 257/98 |
| 2013/0240932 A1* | 9/2013 | Tu | H01L 33/10 257/98 |

* cited by examiner

EPITAXY BASE AND LIGHT-EMITTING DEVICE

CROSS-REFERENCE TO RELATED APPLICATION

This application claims the priority benefit of Taiwan application serial no. 103122875, filed on Jul. 2, 2014. The entirety of the above-mentioned patent application is hereby incorporated by reference herein and made a part of this specification.

BACKGROUND

Technical Field

The invention relates to an epitaxy base and a light-emitting device, and particularly relates to an epitaxy base adapted to produce a light-emitting device and a light-emitting device capable of emitting a white light.

Related Art

Since light-emitting diode (LED) has advantages of long service life, small volume, high shock resistance, low heat generation and low power consumptions, etc., it has been widely used as indicators or light sources of home appliances and various equipment. In recent years, the LEDs are developed towards a trend of multi-color and high brightness, so that application domains thereof have been expanded to large outdoor billboards, traffic lights, and related domains. In the future, the LED probably becomes a main illumination light source having both of a power saving effect and an environmental protection effect.

Generally, in order to make the LED to emit lights of different colors, a fluorescent adhesive layer is formed on the LED disposed on a base through a mold adhesive filling method. When the light emitted by the LED irradiates the fluorescent adhesive layer, the light is converted to emit light of other colors. However, according to the above method, the adhesive filling process is additionally performed after fabrication of the LED is completed, which is relatively complicated in procedure.

SUMMARY

The invention is directed to an epitaxy base adapted to form a light-emitting device capable of emitting a white light thereon.

The invention is directed to a light-emitting device capable of emitting a white light.

The invention provides an epitaxy base, adapted to form a light-emitting device thereon. The epitaxy base includes a substrate and a patterned wavelength conversion structure. The patterned wavelength conversion structure is disposed on a part of the substrate and protrudes out from the substrate.

In an embodiment of the invention, the patterned wavelength conversion structure is composed of a mono-crystalline fluorescent material or a polycrystalline fluorescent material.

In an embodiment of the invention, the patterned wavelength conversion structure includes yttrium aluminium garnet (YAG).

In an embodiment of the invention, a temperature tolerance of the patterned wavelength conversion structure is higher than 1000° C.

In an embodiment of the invention, the epitaxy base further includes a wrapping layer wrapping the patterned wavelength conversion structure and exposing a part of the substrate, where a temperature tolerance of the wrapping layer is higher than the temperature tolerance of the patterned wavelength conversion structure.

In an embodiment of the invention, the wrapping layer includes silicon oxide or aluminium oxide, and the patterned wavelength conversion structure includes a mono-crystalline series, a polycrystalline series or a non-crystalline series fluorescent material.

In an embodiment of the invention, the substrate has a patterned surface.

In an embodiment of the invention, the epitaxy base further includes a nucleation layer disposed between the substrate and the patterned wavelength conversion structure.

In an embodiment of the invention, the epitaxy base further includes a nucleation layer covering the substrate and the patterned wavelength conversion structure.

The invention provides a light-emitting device including an epitaxy base, a first type semiconductor layer, an emitting layer and a second type semiconductor layer. The epitaxy base includes a substrate and a patterned wavelength conversion structure. The patterned wavelength conversion structure is disposed on a part of the substrate and protrudes out from the substrate. The first type semiconductor layer is disposed on the substrate and the patterned wavelength conversion structure. The emitting layer is disposed on the first type semiconductor layer. The second type semiconductor layer is disposed on the emitting layer.

In an embodiment of the invention, the patterned wavelength conversion structure is composed of a mono-crystalline fluorescent material or a polycrystalline fluorescent material.

In an embodiment of the invention, the patterned wavelength conversion structure includes yttrium aluminium garnet (YAG).

In an embodiment of the invention, a temperature tolerance of the patterned wavelength conversion structure is higher than 1000° C.

In an embodiment of the invention, the epitaxy base further includes a wrapping layer wrapping the patterned wavelength conversion structure and exposing a part of the substrate, where a temperature tolerance of the wrapping layer is higher than the temperature tolerance of the patterned wavelength conversion structure.

In an embodiment of the invention, the wrapping layer includes silicon oxide or aluminium oxide, and the patterned wavelength conversion structure includes a mono-crystalline series, a polycrystalline series or a non-crystalline series fluorescent material.

In an embodiment of the invention, the substrate has a patterned surface.

In an embodiment of the invention, the epitaxy base further includes a nucleation layer disposed between the substrate and the patterned wavelength conversion structure, and the first type semiconductor layer is disposed on the patterned wavelength conversion structure and the nucleation layer.

In an embodiment of the invention, the epitaxy base further includes a nucleation layer disposed on the substrate and the patterned wavelength conversion structure, and the first type semiconductor layer is disposed on the nucleation layer.

According to the above descriptions, in the epitaxy base of the invention, the patterned wavelength conversion structure is disposed on a part of the substrate, and the first type semiconductor layer, the emitting layer and the second type semiconductor layer are sequentially disposed on the epitaxy base to form the light-emitting device. A part of the light emitted by the light-emitting device passes through the patterned wavelength conversion structure, and the other part of the light does not pass through the patterned wavelength conversion structure, such that the light-emitting device itself is capable of emitting lights of a plurality of colors, and the lights of different colors are mixed into a white light. Namely, the light-emitting device is capable of directly emitting the white light without additionally configuring, for example, a fluorescent adhesive layer, etc. thereon. Moreover, in order to tolerate a high temperature produced during a process of forming the first type semiconductor layer, the emitting layer and the second type semiconductor layer, the patterned wavelength conversion structure of the epitaxy base, for example, adopts a material of yttrium aluminium garnet (YAG) with a temperature tolerance higher than 1000° C., or by covering a wrapping layer with high temperature tolerance (for example, silicon oxide or aluminium oxide) on the patterned wavelength conversion structure, the patterned wavelength conversion structure is still capable of converting a wavelength of the light passing there through after a high temperature epitaxy process.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
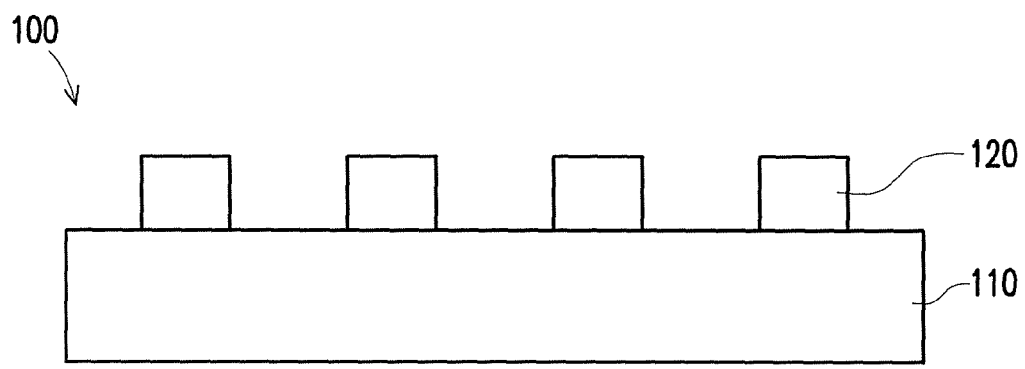
FIG. 1 is a cross-sectional view of an epitaxy base according to an embodiment of the invention.

An epitaxy base of the invention is adapted to form a light-emitting device thereon, where the light-emitting device is capable of directly emitting color lights of a plurality of colors. FIG. 1 is a cross-sectional view of an epitaxy base according to an embodiment of the invention. Referring to FIG. 1, the epitaxy base 100 of the present embodiment includes a substrate 110 and a patterned wavelength conversion structure 120.

In the present embodiment, the substrate 110 is a sapphire substrate, though in other embodiments, any substrate material capable of growing group III-V (for example, group III nitride) semiconductor layer is applicable, for example, Si, $SiO_2$, GaN, AlN, spinnel, SiC, GaAs, $Al_2O_3$, $LiGaO_2$, $LiAlO_2$ or $MgAl_2O_4$, etc.

The patterned wavelength conversion structure 120 is disposed on a part of the substrate 110 and protrudes out from the substrate 110. As shown in FIG. 1, the patterned wavelength conversion structure 120 covers a part of the substrate 110, and exposes the other part of the substrate 110. Since epitaxy layers (for example, a first type semiconductor layer, an emitting layer and a second type semiconductor layer) are required to be stacked on the epitaxy base 100, in order to guarantee the patterned wavelength conversion structure 120 still providing a wavelength conversion function to the light passing there through after a high temperature epitaxy process, in the present embodiment, the patterned wavelength conversion structure 120 is made of a mono-crystalline fluorescent material or a polycrystalline fluorescent material. For example, the material of the patterned wavelength conversion structure 120 can be yttrium aluminium garnet (YAG) with a mono-crystalline structure, as a temperature tolerance of the patterned wavelength conversion structure 120 formed by the yttrium aluminium garnet (YAG) with the mono-crystalline structure is higher than 1000° C., the patterned wavelength conversion structure 120 can tolerate the subsequent high temperature process of the light-emitting device.

Figure 2:
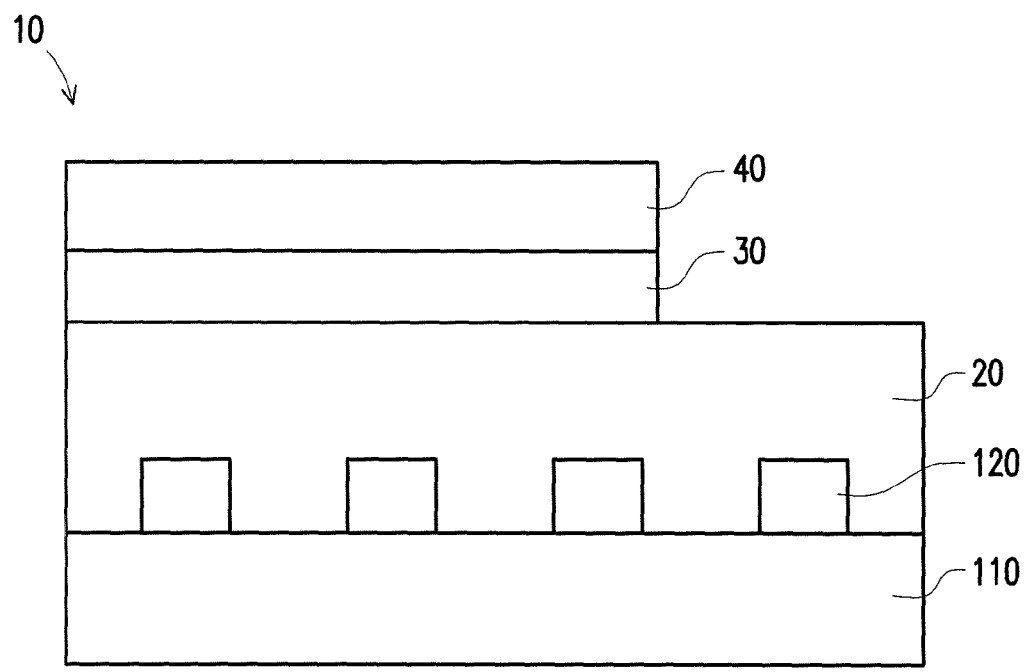
FIG. 2 is a cross-sectional view of a light-emitting device according to an embodiment of the invention.

Taking the epitaxy base 100 of FIG. 1 as an example, the light-emitting device 10 is fabricated thereon. FIG. 2 is a cross-sectional view of a light-emitting device according to an embodiment of the invention. Referring to FIG. 2, the light-emitting device 10 of the present embodiment includes the epitaxy base 100, a first type semiconductor layer 20, an emitting layer 30 and a second type semiconductor layer 40. The first type semiconductor layer 20 is disposed on the substrate 110 and the patterned wavelength conversion structure 120, the emitting layer 30 is disposed on the first type semiconductor layer 20, and the second type semiconductor layer 40 is disposed on the emitting layer 30. In the present embodiment, the first type semiconductor layer 20 is, for example, an n-type nitride semiconductor stacked layer, the second type semiconductor layer 40 is, for example, a p-type nitride semiconductor layer, and the emitting layer 30 is, for example, multiple quantum wells. The first type semiconductor layer 20, the emitting layer 30 and the second type semiconductor layer 40 can be sequentially formed on the epitaxy base 100 through metal organic chemical vapor deposition (MOCVD), though fabrication of the first type semiconductor layer 20, the emitting layer 30 and the second type semiconductor layer 40 is not limited thereto.

Moreover, since lattice constants difference between the first type semiconductor layer 20 and the epitaxy base 100 is quite large, a nucleation layer and/or a buffer layer (not shown) is configured between the epitaxy base 100 and the first type semiconductor layer 20 to mitigate a lattice mismatch phenomenon between the first type semiconductor layer 20 and the epitaxy base 100 caused by the lattice constant difference there between. In other words, the nucleation layer and/or the buffer layer can enhance epitaxy quality of the first type semiconductor layer 20, the emitting layer 30 and the second type semiconductor layer 40 subsequently staked on the epitaxy base 100 to decrease a defect density, so as to avoid influencing a light-emitting efficiency of the light-emitting device. Generally, the nucleation layer and/or the buffer layer includes group III-V compound semiconductor, for example, gallium nitride or aluminium nitride. Certainly, the type of the material of the nucleation layer and/or the buffer layer is not limited thereto. In an exemplary embodiment, after a nucleation layer of aluminium nitride is formed on the epitaxy base 100, a buffer layer of gallium nitride is further formed, and by using the two types of materials, the epitaxy quality of the subsequent first type semiconductor layer 20, the emitting layer 30 and the second type semiconductor layer 40 is better.

In the present embodiment, since the patterned wavelength conversion structure 120 is only disposed on a part of the substrate 110, a part of the light emitted by the light-emitting device 10 passes through the patterned wavelength conversion structure 120, and the wavelength of such part of the light is converted, and the wavelength of the other part of the light that does not pass through the patterned wavelength conversion structure 120 is maintained, such that the light-emitting device 10 is capable of directly emitting lights of a plurality of colors after the epitaxy process is completed without additionally configuring a fluorescent adhesive structure, etc. The lights of different colors can be mixed into a white light, so that the light-emitting device 10 may directly emit the white light.

Certainly, only one type of the epitaxy base 100 is provided above, though the type of the epitaxy base is not limited thereto, and the other types of the epitaxy bases that allow the light-emitting device disposed thereon to emit lights of a plurality of colors are introduced below.

Figure 3:
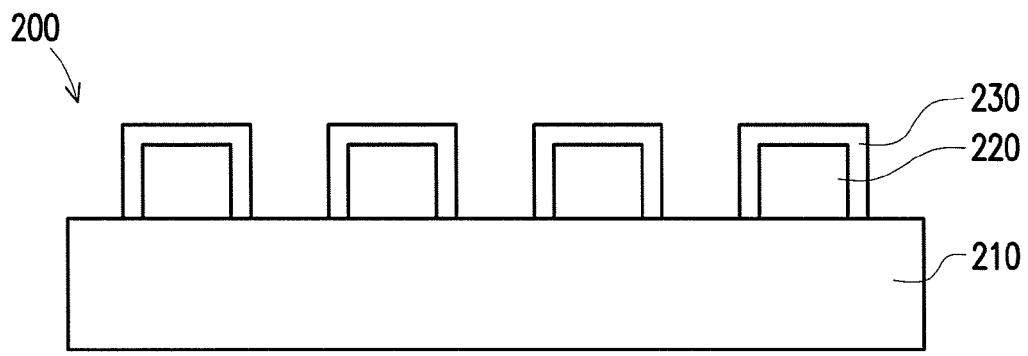
FIG. 3 is a cross-sectional view of an epitaxy base according to another embodiment of the invention.

FIG. 3 is a cross-sectional view of an epitaxy base according to another embodiment of the invention. Referring to FIG. 3, a main difference between the epitaxy base 200 of FIG. 3 and the epitaxy base 100 of FIG. 1 is that the epitaxy base 200 of FIG. 3 further includes a wrapping layer 230, and the wrapping layer 230 wraps the patterned wavelength conversion structure 220 and exposes a part of the substrate 210.

Since a temperature of the epitaxy process is relatively high, the patterned wavelength conversion structure 220 is required to have a high temperature tolerance in order to guarantee the patterned wavelength conversion structure 220 still providing the wavelength conversion function to the light passing there through after the high temperature epitaxy process, so that the material of the patterned wavelength conversion structure 220 is limited. In the present embodiment, the wrapping layer 230 wraps the patterned wavelength conversion structure 220. In other words, the subsequent epitaxy process is implemented on the substrate 210 and the wrapping layer 230, so that the patterned wavelength conversion structure 220 can be made of a material with a lower temperature tolerance as long as a temperature tolerance of the wrapping layer 230 that wraps the patterned wavelength conversion structure 220 is higher than the temperature of the epitaxy process.

For example, the wrapping layer 230 may include silicon oxide or aluminium oxide, etc. with higher temperature tolerance, and the patterned wavelength conversion structure 220 may adopt a wavelength conversion material with no limitation in temperature tolerance such as a mono-crystalline series, a polycrystalline series or a non-crystalline series fluorescent material, etc. In the epitaxy base 200 of the present embodiment, as the patterned wavelength conversion structure 220 is protected by the wrapping layer 230 wrapping the patterned wavelength conversion structure 220, the influence of the subsequent high temperature epitaxy process on the patterned wavelength conversion structure 220 is mitigated. Certainly, in other embodiments, the patterned wavelength conversion structure 220 can still adopt the material that can tolerate the high temperature epitaxy process such as the yttrium aluminium garnet (YAG), etc., and the types of the wrapping layer 230 and the patterned wavelength conversion structure 220 are not limited to that described above.

Figure 4:
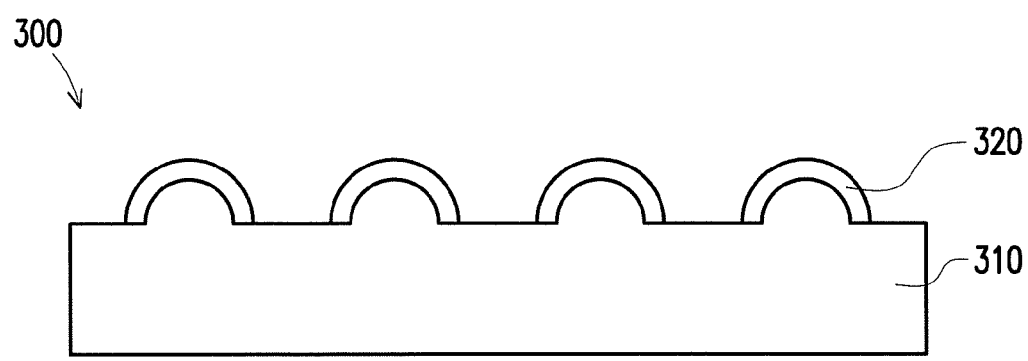
FIG. 4 is a cross-sectional view of an epitaxy base according to still another embodiment of the invention.

FIG. 4 is a cross-sectional view of an epitaxy base according to still another embodiment of the invention. Referring to FIG. 4, a main difference between the epitaxy base 300 of FIG. 4 and the epitaxy base 100 of FIG. 1 is that in FIG. 1, a surface of the substrate 110 contacting the patterned wavelength conversion structure 120 is a plane, and in FIG. 4 a surface of the substrate 310 contacting the patterned wavelength conversion structure 320 is a patterned surface. In detail, in the present embodiment, the substrate 310 has a plurality of semicircular protrusions, and the semicircular protrusions can be used for scattering the light emitted by the light-emitting device (not shown) fabricated on the epitaxy base 300 to reduce a total reflection effect, so as to further improve external quantum efficiency of the light-emitting device fabricated on the epitaxy base 300.

It should be noticed that in FIG. 4, although the patterned wavelength conversion structure 320 is disposed on the semicircular protrusions of the patterned surface of the substrate 310, in other embodiments, a distribution position of the patterned wavelength conversion structure 320 is unnecessary to correspond to positions of the semicircular protrusions, for example, the patterned wavelength conversion structure 320 can be partially located on the semicircular protrusions of the substrate 310 and partially located on flat portions, or can be all located on the flat portions of the substrate 310.

Figure 5:
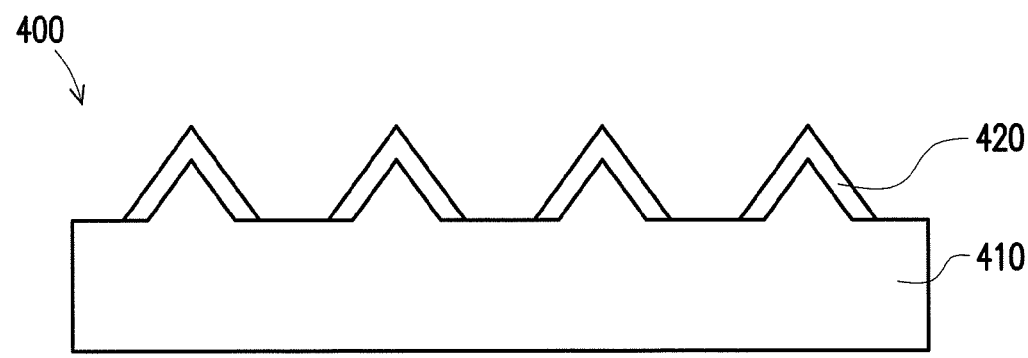
FIG. 5 is a cross-sectional view of an epitaxy base according to still another embodiment of the invention.

Moreover, the type of the patterned surface is not limited to that described above. FIG. 5 is a cross-sectional view of an epitaxy base according to still another embodiment of the invention. Referring to FIG. 5, in FIG. 5, the substrate 410 has a plurality of cone-shaped protrusions, such that the light emitted by the light-emitting device (not shown) fabricated on the epitaxy base 400 can be scattered to reduce the total reflection effect, so as to improve the external quantum efficiency of the light-emitting device. In an embodiment that is not shown, the patterned surface of the substrate can be a surface having a plurality of recess portions or simultaneously having a plurality of recess portions and a plurality of protrusions. Certainly, the type of the patterned surface is not limited to that described above.

Figure 6:
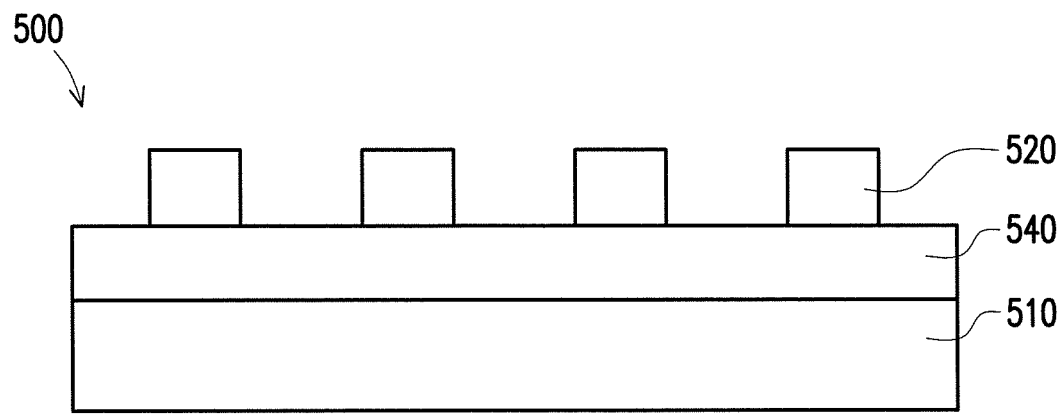
FIG. 6 is a cross-sectional view of an epitaxy base according to still another embodiment of the invention.

FIG. 6 is a cross-sectional view of an epitaxy base according to still another embodiment of the invention. Referring to FIG. 6, a main difference between the epitaxy base 500 of FIG. 6 and the epitaxy base 100 of FIG. 1 is that the epitaxy base 500 of FIG. 6 further includes a nucleation layer 540 disposed between the substrate 510 and the patterned wavelength conversion structure 520. When the light-emitting device (not shown) is to be stacked on the epitaxy base 500, the first type semiconductor layer (not shown) is disposed on the patterned wavelength conversion structure 520 and the nucleation layer 540.

In the present embodiment, an effect of the nucleation layer 540 is to prevent elements (for example, gallium, etc.) in the semiconductor layer from reacting with elements in the substrate 510 to form a compound during subsequent growth of the semiconductor layer, where formation of the compound causes generation of amorphous structure or non-mono-crystalline structure to spoil a light-emitting intensity of the light-emitting device. The nucleation layer is, for example, made of aluminium nitride, though the type of the nucleation layer is not limited thereto.

Figure 7:
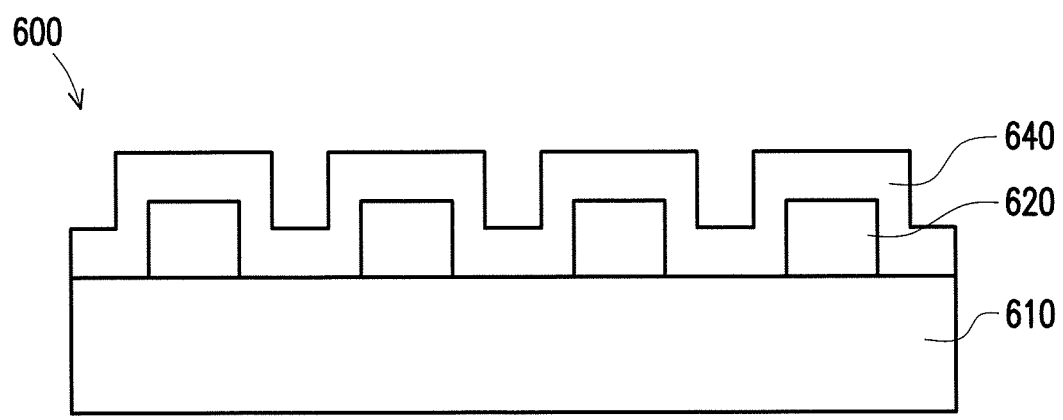
FIG. 7 is a cross-sectional view of an epitaxy base according to still another embodiment of the invention.

FIG. 7 is a cross-sectional view of an epitaxy base according to still another embodiment of the invention. Referring to FIG. 7, a main difference between the epitaxy base 600 of FIG. 7 and the epitaxy base 500 of FIG. 6 is that the position of the nucleation layer 640 of the epitaxy base 600 of FIG. 7 is different. To be specific, in the present embodiment, the nucleation layer 640 covers the substrate 610 and the patterned wavelength conversion structure 620. Moreover, in the present embodiment, the nucleation layer 640 substantially has an even thickness, and the nucleation layer 640 rises and falls along with a shape of the patterned wavelength conversion structure 620 protruding out form the substrate 610, though in other embodiments, the nucleation layer 640 may have a thicker thickness above the substrate 610 and have a thinner thickness above the patterned wavelength conversion structure 620, such that the nucleation layer 640 presents a flat surface at a side away from the substrate 610. Certainly, the type of the nucleation layer 640 is not limited thereto. Moreover, in the present embodiment, when the light-emitting device (not shown) is to be stacked on the epitaxy base 600, the first type semiconductor layer (not shown) is disposed on the nucleation layer 640. Certainly, in order to improve the epitaxy quality, a buffer layer of group III-V compound semiconductor can be added between the nucleation layer 640 and the first type semiconductor layer (not shown).

It should be noticed that although only the epitaxy base 100 of FIG. 1 is taken as an example to fabricate the light-emitting device 10 shown in FIG. 2 thereon, the epitaxy bases 200, 300, 400, 500 and 600 of the other embodiments can also be stacked with epitaxy layers to fabricate the light-emitting device capable of directly emitting the white light, and details thereof are not repeated.

In summary, in the epitaxy base of the invention, the patterned wavelength conversion structure is disposed on a part of the substrate, and the first type semiconductor layer, the emitting layer and the second type semiconductor layer are sequentially disposed on the epitaxy base to form the light-emitting device. A part of the light emitted by the light-emitting device passes through the patterned wavelength conversion structure, and the other part of the light does not pass through the patterned wavelength conversion structure, such that the light-emitting device itself is capable of emitting lights of a plurality of colors, and the lights of different colors are mixed into a white light. Namely, the light-emitting device is capable of directly emitting the white light without additionally configuring, for example, a fluorescent adhesive layer, etc. thereon. Moreover, in order to tolerate a high temperature produced during a process of forming the first type semiconductor layer, the emitting layer and the second type semiconductor layer, the patterned wavelength conversion structure of the epitaxy base, for example, adopts a material of yttrium aluminium garnet (YAG) with a temperature tolerance higher than 1000° C., or by covering a wrapping layer with high temperature tolerance (for example, silicon oxide or aluminium oxide) on the patterned wavelength conversion structure, the patterned wavelength conversion structure is still capable of converting a wavelength of the light passing there through after a high temperature epitaxy process.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An epitaxy base, adapted to form a light-emitting device thereon, the epitaxy base comprising:
a substrate;
a plurality of patterned wavelength conversion structures, disposed on parts of the substrate and protruding out from the substrate; and
a wrapping layer, wrapping the patterned wavelength conversion structures and exposing a part of the substrate, wherein the part of the substrate exposed by the wrapping layer is located between the parts of the substrate on which the patterned wavelength conversion structures are disposed, wherein a temperature tolerance of the wrapping layer is higher than a temperature tolerance of the patterned wavelength conversion structures.

2. The epitaxy base as claimed in claim 1, wherein each of the patterned wavelength conversion structures is composed of a mono-crystalline fluorescent material or a polycrystalline fluorescent material.

3. The epitaxy base as claimed in claim 2, wherein each of the patterned wavelength conversion structures comprises yttrium aluminum garnet (YAG).

4. The epitaxy base as claimed in claim 1, wherein the temperature tolerance of the patterned wavelength conversion structures is higher than 1000° C.

5. The epitaxy base as claimed in claim 1, wherein the wrapping layer comprises silicon oxide or aluminum oxide, and each of the patterned wavelength conversion structure comprises a mono-crystalline series, a polycrystalline series or a non-crystalline series fluorescent material.

6. A light-emitting device, comprising:
an epitaxy base, comprising:
a substrate;
a patterned wavelength conversion structure, disposed on a part of the substrate and protruding out from the substrate; and
a wrapping layer wrapping the patterned wavelength conversion structure and exposing a part of the substrate, and a temperature tolerance of the wrapping layer is higher than a temperature tolerance of the patterned wavelength conversion structure;
a first type semiconductor layer, disposed on the substrate, the patterned wavelength conversion structure and the wrapping layer;
an emitting layer, disposed on the first type semiconductor layer; and
a second type semiconductor layer, disposed on the emitting layer.

7. The light-emitting device as claimed in claim 6, wherein the patterned wavelength conversion structure is composed of a mono-crystalline fluorescent material or a polycrystalline fluorescent material.

8. The light-emitting device as claimed in claim 7, wherein the patterned wavelength conversion structure comprises yttrium aluminum garnet (YAG).

9. The light-emitting device as claimed in claim 6, wherein a temperature tolerance of the patterned wavelength conversion structure is higher than 1000° C.

10. The light-emitting device as claimed in claim 6, wherein the wrapping layer comprises silicon oxide or aluminum oxide, and the patterned wavelength conversion structure comprises a mono-crystalline series, a polycrystalline series or a non-crystalline series fluorescent material.

* * * * *